(12) United States Patent
Aronowitz et al.

(10) Patent No.: US 6,743,474 B1
(45) Date of Patent: Jun. 1, 2004

(54) METHOD FOR GROWING THIN FILMS

(75) Inventors: Sheldon Aronowitz, San Jose, CA (US); Vladimir Zubkov, Mountain View, CA (US); Richard Schinella, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 282 days.

(21) Appl. No.: 10/035,501

(22) Filed: Oct. 25, 2001

(51) Int. Cl.[7] .............................................. C23C 16/00
(52) U.S. Cl. .................. 427/255.26; 427/374.1
(58) Field of Search .......................... 427/255.26, 374.1

(56) References Cited

U.S. PATENT DOCUMENTS

| 5,255,067 | A | * | 10/1993 | Carrabba et al. | ............ 356/301 |
| 5,746,826 | A | * | 5/1998 | Hasegawa et al. | ............ 117/90 |
| 6,464,779 | B1 | * | 10/2002 | Powell et al. | .................. 117/89 |
| 6,482,740 | B2 | * | 11/2002 | Soininen et al. | ............ 438/686 |

* cited by examiner

*Primary Examiner*—Bret Chen
(74) *Attorney, Agent, or Firm*—Beyer Weaver Thomas

(57) ABSTRACT

A method of forming a layer over a substrate is provided. Generally, a layer of a first reactive species is deposited over the substrate. The layer of the first reactive species is reacted with a second reactive species to create a first product. Unreacted reactive species is preferentially desorbed leaving a layer of the first product.

12 Claims, 5 Drawing Sheets

METHOD FOR GROWING THIN FILMS

FIELD OF THE INVENTION

The present invention relates generally to the creation of thin layers. More specifically, the invention relates to the creation of a plurality of monolayers.

BACKGROUND OF THE INVENTION

Atomic layer epitaxy (ALE) has become widely adopted as a method of providing atomic layer deposition and very thin film creation. The basic concept is a sequential exposure of a suitable surface to a precursor species followed by a co-reactant species. Originally, fluxes of two elements were alternated. Later, alternating molecular precursors were employed, which allowed expansion to several different co-reactant species. In both cases, reactants (elements and molecular precursors) are chemisorbed at each layer of creation. This resulted in self-limiting chemistry. Approaches with molecular precursors use reactants that are volatile, such as $SiCl_4$ and $H_2O$ or where at least one co-reactant is in a gaseous state.

ALE may be considered a variant of the more general method of molecular beam epitaxy (MBE), where a thin film deposition process is controlled by flux intensity, time exposure, and temperature. Molecular beam epitaxy may be done in clusters, which may make control of the number of layers difficult. Atomic layer epitaxy may allow a layer-by-layer deposition, which may provide control over the number of layers deposited. Such molecular beam epitaxy does not always require chemisorption, but may instead use physisorption.

In semiconductor processing, barrier layers may be used to separate one material from another. For example, it may be desirable to use a barrier layer to separate a copper conductor layer from a silicon layer. Such barrier layers must be thick enough to provide complete separation, but thin enough to allow a more compact chip. To provide a barrier layer that is less than 100 nanometers instead of hundreds of nanometers, and provides complete separation is desirable. Present techniques for creating barrier layers, such as sputtering, chemical vapor deposition, and plasma enhanced chemical vapor deposition are normally used to create barrier layers that are hundreds of nanometers thick. Such barriers have a porosity that may require a thick layer. In addition, contaminants in the barrier layer may make the barrier layer less effective.

It would be desirable to create thin layers by an atomic layer deposition process that is an alternative to molecular beam epitaxy and atomic layer epitaxy. It would be desirable to create thin layers that have a high purity and low porosity, which may be more effective as barrier layers.

SUMMARY OF THE INVENTION

To achieve the foregoing and other objects and in accordance with the purpose of the present invention, a method of forming a layer over a substrate is provided. Generally, a layer of a first reactive species is deposited over the substrate. The layer of the first reactive species is reacted with a second reactive species to create a first product. Unreacted reactive species is preferentially desorbed, leaving a layer of the first product.

In addition, a thin film of a plurality of layers over a substrate is provided where each layer is formed by a method. Generally, a layer of a first reactive species is deposited over the substrate. The layer of the first reactive species is reacted with a second reactive species to create a first product. Unreacted reactive species is preferentially desorbed, leaving a layer of the first product.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
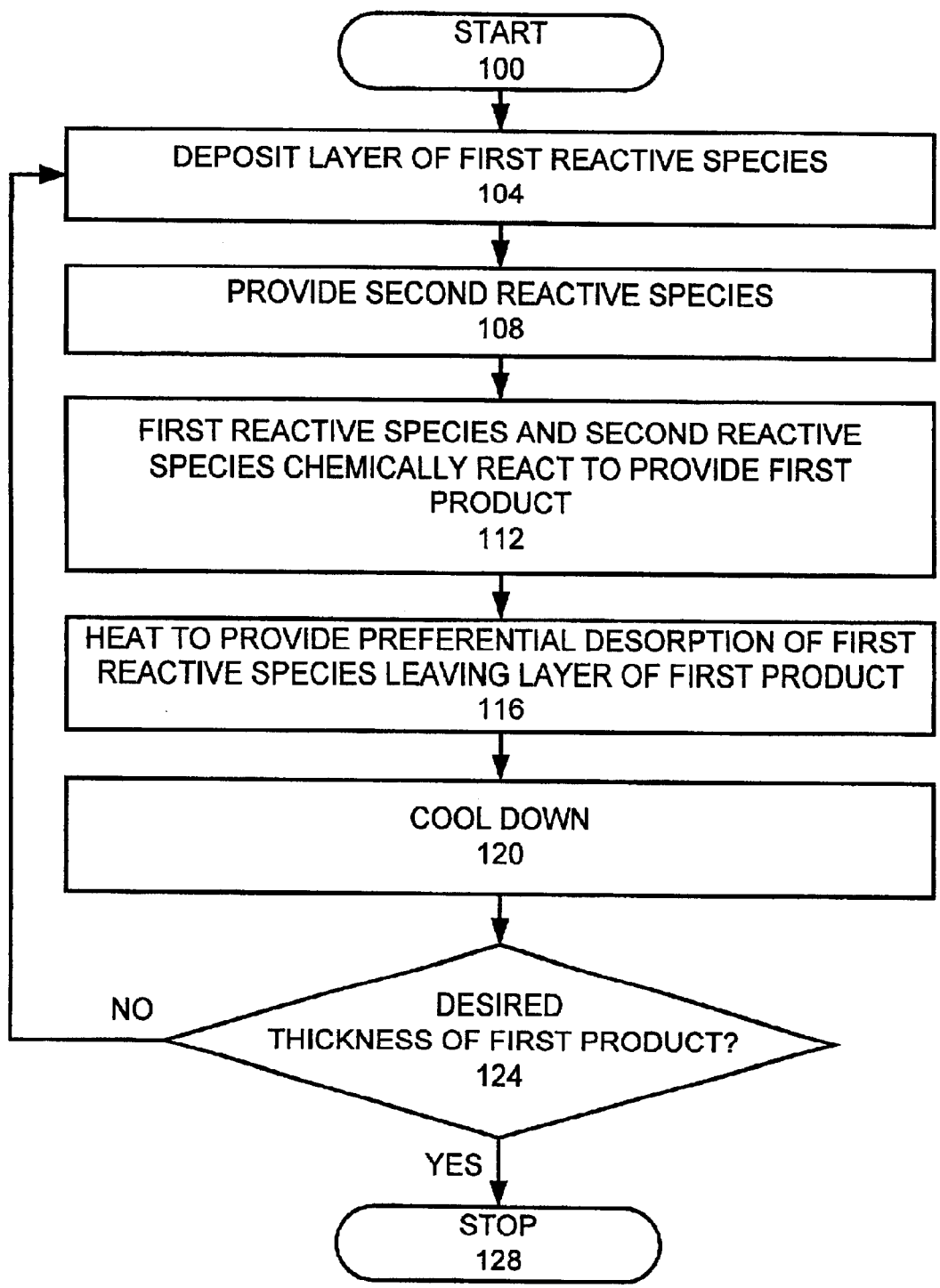
FIG. 1 is a flow chart of a process used in a preferred embodiment of the invention.

FIG. 1 is a flow chart of a process used in a preferred embodiment of the invention. First, a layer of a first reactive species is deposited (step 104). Preferably, a monolayer, a single molecule or atom thick layer of the first reactive species, is deposited on a substrate. The deposition may be accomplished by condensation (physisorption) of a vapor of the first reactive species or by chemisorption of the first reactive species on the substrate. Both chemisorption and physisorption are adsorption processes. If the deposition is not a self-limiting chemisorption process, then conventional deposition techniques would be used to provide monolayer coverage. Preferably, the deposition is performed by a vapor deposition. Preferably, the vapor deposition relies on a substrate that is at a temperature to result in vapor condensation. Preferably, the vapor is created by heating the first reactive species from a solid or liquid form, which is physisorbed, which is called simple vapor deposition.

A second reactive species is provided (step 108). The second reactive species is preferably in the form of a low energy plasma, neutral agents, or radicals. The first reactive species and the second reactive species chemically react to provide a first product (step 112). Additional products may also be produced. In addition, other reactive species may also be added to provide the first product. Heat is used to provide preferential desorption of unreacted first reactive species, leaving a layer of the first product (step 116). Preferably, the substrate is heated to a temperature which allows preferential desorption, since at that temperature the vapor pressure of the first reactive species is much greater than the vapor pressure of the first product. This is preferably accomplished by providing that the first product has a higher melting point than the first reactive species. Cooling is then provided (step 120). Preferably, the substrate is cooled to a temperature that will allow the first reactive species to form a new layer over the substrate. A determination is made of whether a desired thickness of the first product is reached (step 124). If such a thickness is not reached, the process returns to step 104. If the thickness is reached, the process may be stopped (step 128). Since the first reactive species is removed by heating the layer, which may be done by heating the substrate, in the preferred embodiment, the first reactive species is physisorbed not chemisorbed.

If the reactions involve multiple reactive species which condense, then the product formed should have a vapor pressure much lower than the vapor pressure of any reactive species at a temperature that may be used to desorb the unreacted species.

EXAMPLE 1

Figure 2:
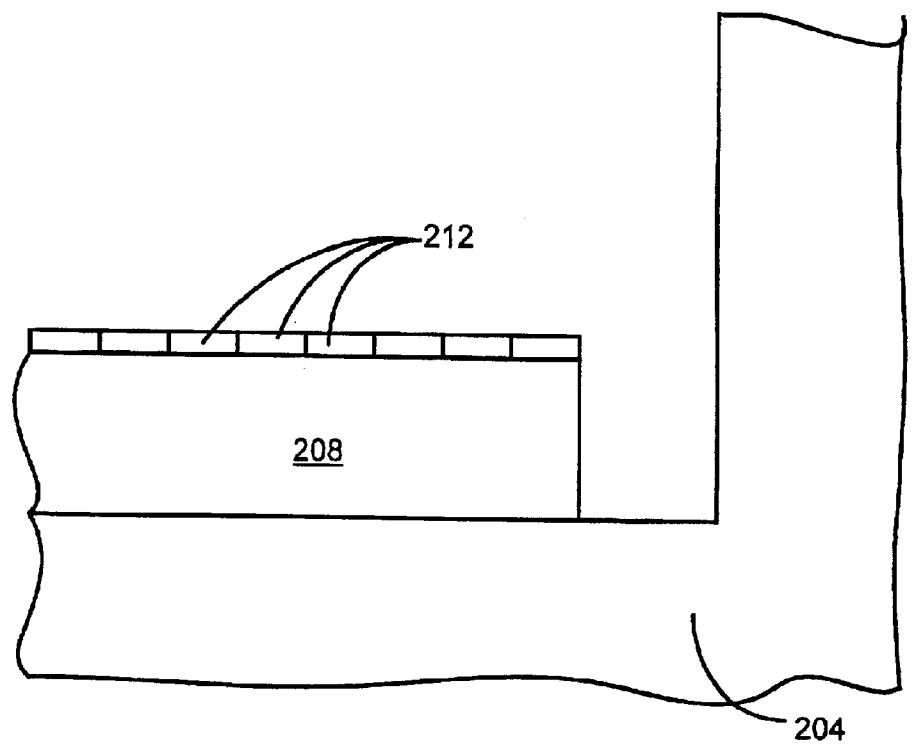
FIG. 2 is a schematic illustration of part of an evacuation chamber with a substrate upon which a monolayer of molecules has been deposited.
Figure 3:
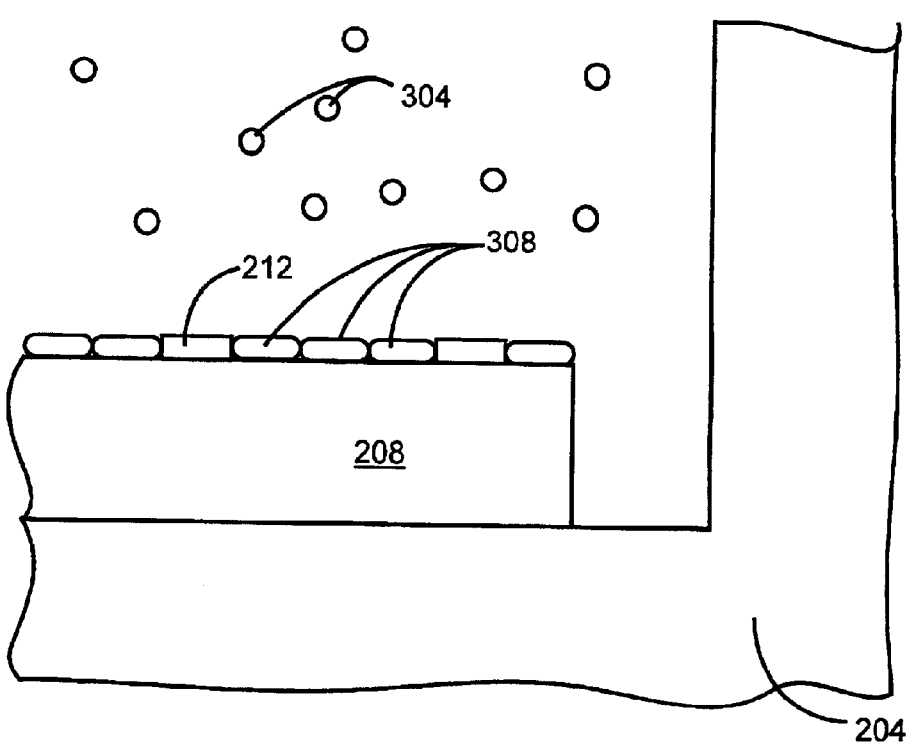
FIG. 3 schematically illustrates the part of the evacuation chamber shown in FIG. 2, with a second reactive species being added.
Figure 4:
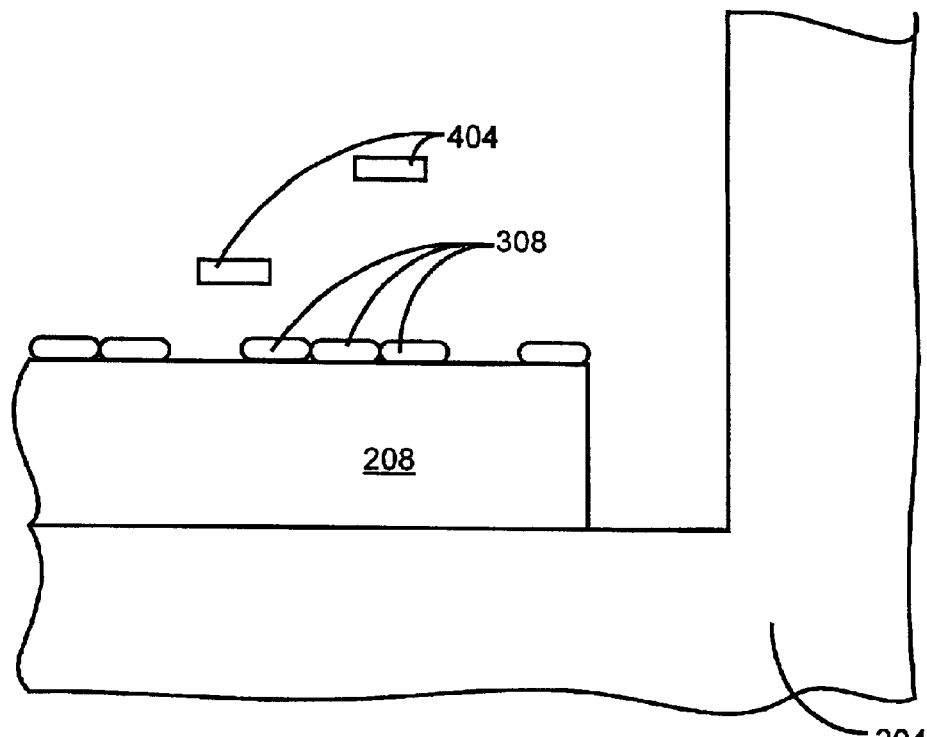
FIG. 4 schematically illustrates the part of the evacuation chamber shown in FIG. 3, with unreacted first reactive species being desorbed.
Figure 5:
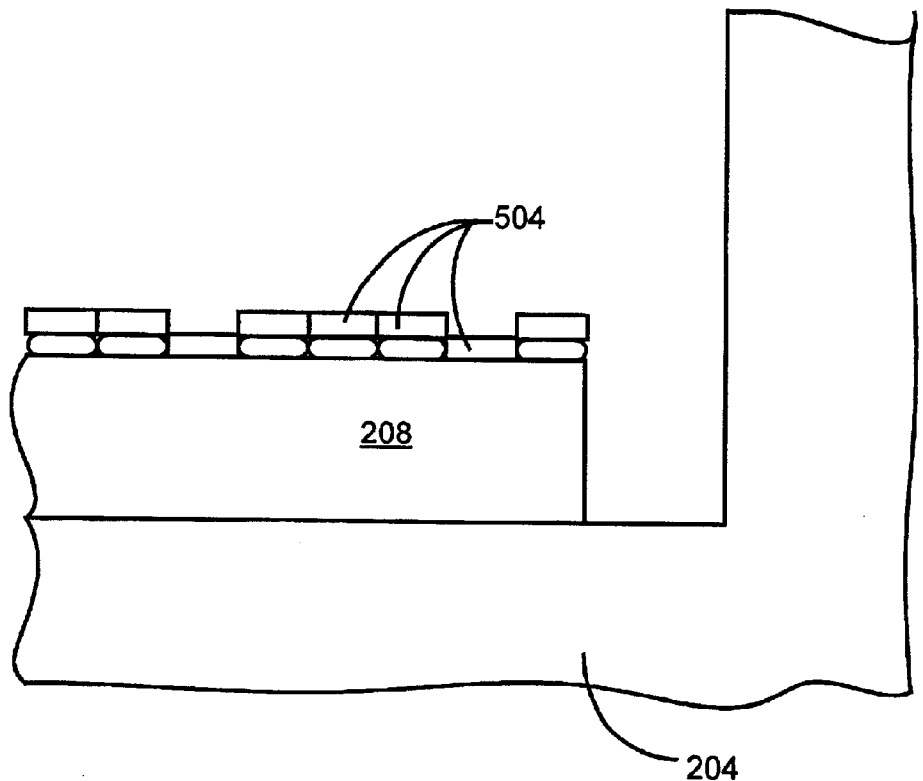
FIG. 5 schematically illustrates the part of the evacuation chamber shown in FIG. 4, with a second monolayer of the first reactive species.
Figure 6:
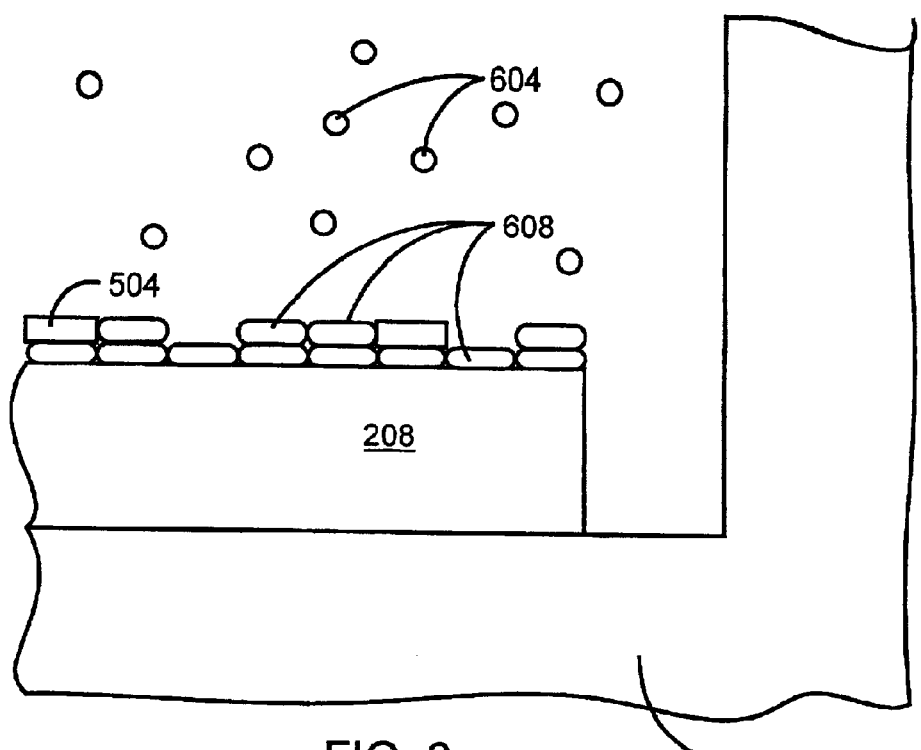
FIG. 6 schematically illustrates the part of the evacuation chamber shown in FIG. 5, with a second reactive species being added.
Figure 7:
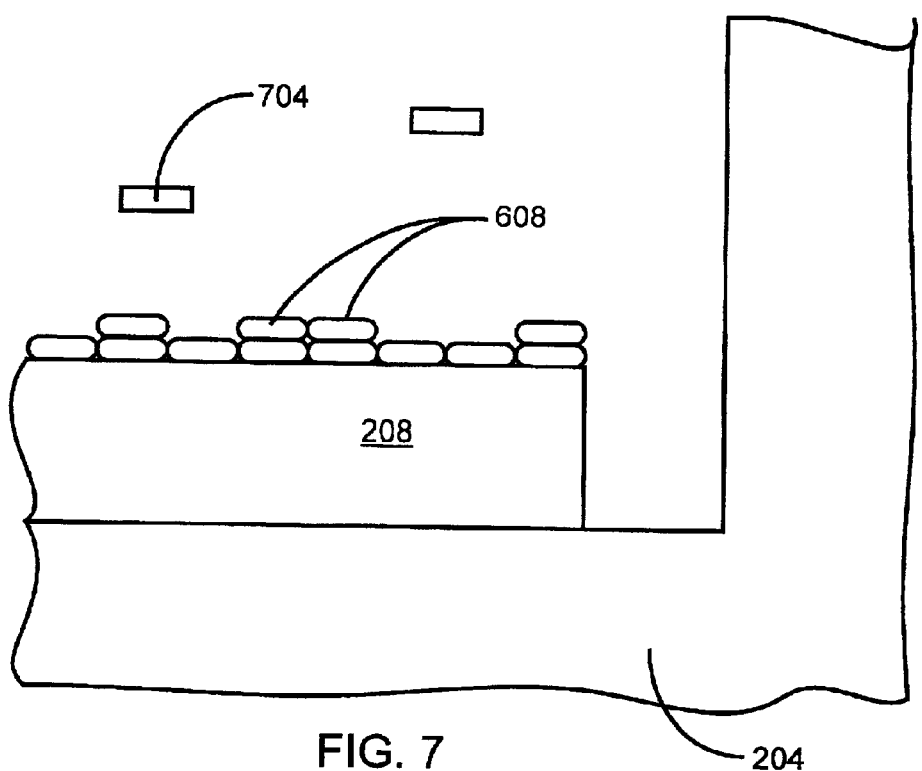
FIG. 7 schematically illustrates the part of the evacuation chamber shown in FIG. 6, with unreacted first reactive species being desorbed.

In a first example, Aluminum Chloride ($AlCl_3$) is used as a first reactive species. The $AlCl_3$ is provided as a vapor, which is deposited as a monolayer on a substrate in a suitable evacuated reaction chamber, where the substrate is maintained at a temperature less than or equal to 25° C. (step 104). Examples of a substrate may be silicon, silicon oxide, silicon nitride, and quartz. To facilitate understanding, FIG. 2 is a schematic illustration of part of an evacuation chamber 204 with a substrate 208 upon which a monolayer of $AlCl_3$ molecules 212 has been deposited. Once the monolayer is formed, the $AlCl_3$ vapor is stopped. Next, a low energy plasma of fluorine 304 is provided (step 108), as schematically illustrated in FIG. 3. The fluorine reacts with the aluminum to form aluminum fluoride 308 according to the equation $AlCl_3+3F \rightarrow AlF_3+3Cl$ (step 112). $AlCl_3$ has a vapor pressure at 58° C. of approximately 7 mTorr. $AlF_3$ would need to be heated to about 744° C. to have a comparable vapor pressure. The substrate temperature is raised to about 100° C., where the vapor pressure for solid $AlCl_3$ is greater than 700 mTorr. A high vacuum is maintained to preferentially desorb unreacted $AlCl_3$ 404, leaving a layer of $AlF_3$ (step 116), as schematically illustrated in FIG. 4. The substrate is then cooled to room temperature (about 25° C.) (step 120). If a single monolayer of $AlF_3$ is desired, then the process is stopped. If more monolayers are desired, then the process returns to step 104 and a second monolayer of $AlCl_3$ 504 is deposited (step 104) as schematically illustrated in FIG. 5. The low energy plasma of fluorine 604 is provided (step 108), as schematically illustrated in FIG. 6. The fluorine reacts with the aluminum to form aluminum fluoride 608 (step 112). The substrate temperature is raised to about 100° C. A high vacuum is maintained to preferentially desorb unreacted $AlCl_3$ 704, leaving a second layer of $AlF_3$ (step 116), as schematically illustrated in FIG. 7. The substrate is then cooled to room temperature (about 25° C.) (step 120). This process of these series of steps is continued until the desired thickness of the layer is reached. After several tens of monolayers are created, a complete layer of a few tens of monolayers may be provided.

In variations of this example, a third reactive species of a low energy hydrogen plasma may be provided before the second reactive species of fluorine is provided. This results in the reactions: $AlCl_3+3H \rightarrow Al+3HCl$ and $Al+3F \rightarrow AlF_3$.

EXAMPLE 2

Zirconium Bromide ($ZrBr_4$) is a suitable first reactive species because the vapor pressure of $ZrBr_4$ at 136° C. is about 7 mTorr and increases to about 700 mTorr when heated to about 200° C. At 360° C., $ZrBr_4$ sublimes. Zirconium oxide $ZrO_2$ has a melting point of about 2710° C.

In this example, $ZrBr_4$ is used as a first reactive species. The $ZrBr_4$ is provided as a vapor, which is deposited as a monolayer on a substrate in a suitable evacuated reaction chamber, where the substrate is maintained at a temperature less than or equal to 25° C. (step 104). Once the monolayer is formed, the $ZrBr_4$ vapor is stopped. Next, a low energy plasma of oxygen is provided (step 108). The oxygen reacts with the zirconium to form $ZrO_2$, according to the equation $ZrBr_4+O_2 \rightarrow ZrO_2+4Br$ (step 112). The substrate temperature is raised to about 200° C., where the vapor pressure for solid $ZrBr_4$ is greater than 700 mTorr. A high vacuum is maintained to preferentially desorb unreacted $ZrBr_4$, leaving a layer of $ZrO_2$ (step 116). The substrate is then cooled to room temperature (about 25° C.) (step 120). If a single monolayer of $ZrO_2$ is desired, then the process is stopped. If more monolayers are desired, then the process returns to step 104 and the process is continued until the desired thickness is reached.

EXAMPLE 3

In this example, Beryllium Bromide ($BeBr_2$) is used as a first reactive species. The $BeBr_2$ is provided as a vapor, which is deposited as a monolayer on a substrate in a suitable evacuated reaction chamber, where the substrate is maintained at a temperature less than or equal to 25° C. (step 104). The $BeBr_2$ vapor may be provided by heating a $BeBr_2$ solid to create a vapor. The temperature and pressure of the system may be used to control the deposition of the monolayer. Once the monolayer is formed, the $BeBr_2$ vapor is stopped. Next, a heated mixture of nitrogen and hydrogen is provided in a ratio of approximately 1:3, as a second reactive species and a third reactive species is provided (step 108). A chemical reaction occurs according to the equation $3BeBr_2+N_2+3H_2 \rightarrow Be_3N_2+6HBr$ (step 112). The substrate temperature is raised to about 300° C., since the vapor pressure for solid $BeBr_2$ is greater than 700 mTorr at about 250° C. A high vacuum is maintained to preferentially desorb unreacted $BeBr_2$ and also evacuates HBr, leaving a layer of $Be_3N_2$ (step 116). The substrate is then cooled to room temperature (about 25° C.) (step 120). If a single monolayer of $Be_3N_2$ is desired, then the process is stopped. If more monolayers are desired, then the process returns to step 104 and the process is continued until the desired thickness is reached. The resulting thin film may be used as a barrier layer, which may be thinner than previous barrier layers.

In one variation of this example, a low energy plasma of ammonia may be used in place of nitrogen and hydrogen. Conditions are chosen to yield ionized ammonia molecules as the principal product. This results in the reaction:

$$3BeBr_2 + 2NH_3(plasma) \rightarrow Be_3N_2 + 6HBr$$

In other variations of this example, atomic hydrogen and atomic nitrogen may be used in place of hydrogen and nitrogen. $BeCl_2$ or $BeI_2$ may also be used, if appropriate.

EXAMPLE 4

Refractory borides may be used as barriers or traps to exclude almost any atomic species from a particular region.

In this example, Zirconium Chloride ($ZrCl_4$) is used as a first reactive species. The $ZrCl_4$ is provided as a vapor, which is deposited as a monolayer on a substrate in a suitable evacuated reaction chamber, where the substrate is maintained at a temperature less than or equal to 25° C. (step 104). Once the monolayer is formed, the $ZrCl_4$ vapor is stopped. Next, a heated mixture of boron trichloride and hydrogen in a ratio of approximately 2:5 is provided (step 108). A chemical reaction occurs according to the equation $ZrCl_4 + 2BCl_3 + 5H_2 \rightarrow ZrB_2 + 10HCl$ (step 112). The substrate temperature is raised to about 200° C., since the vapor pressure for solid $ZrCl_4$ is greater than 750 mTorr at about 200° C. A vacuum is maintained to preferentially desorb unreacted $ZrCl_4$ and also evacuates HCl, leaving a layer of $ZrB_2$ (step 116). The substrate is then cooled to room temperature (about 25° C.) (step 120). If a single monolayer of $ZrB_2$ is desired, then the process is stopped. If more monolayers are desired, then the process returns to step 104 and the process is continued until the desired thickness is reached. The resulting thin film may be used as a barrier layer, which may be thinner than previous barrier layers.

In one variation of this example, a low energy plasma of diborane may be used in place of boron trichloride and hydrogen. Conditions are chosen to yield ionized borane molecules as the principal product. This results in the reaction:

$$ZrCl_4 + 2BH_3(Plasma) \rightarrow ZrB_2 + 4HCl + H_2$$

In another variation of this example, atomic hydrogen and atomic boron may be used in place of boron trichloride and hydrogen. This results in the reaction:

$$ZrCl_4 + 4H \rightarrow Zr + 4HCl \text{ and } Zr + 2B \rightarrow ZrB_2$$

The low porosity of the resulting layers and the high purity of the layer may allow a barrier layer that is only several tens of nanometers thick.

EXAMPLE 5

Refractory carbides may also be used as barriers or traps to exclude atomic species from a particular region.

In this example, Zirconium Chloride ($ZrCl_4$) is used as a first reactive species. The $ZrCl_4$ is provided as a vapor, which is deposited as a monolayer on a substrate in a suitable evacuated reaction chamber, where the substrate is maintained at a temperature less than or equal to 25° C. (step 104). Once the monolayer is formed, the $ZrCl_4$ vapor is stopped. Next, a heated flow of methane is provided (step 108). A chemical reaction occurs according to the equation $ZrCl_4 + CH_4 \rightarrow ZrC + 4HCl$ (step 112). The substrate temperature is raised to about 200° C., since the vapor pressure for solid $ZrCl_4$ is greater than 750 mTorr at about 200° C. A high vacuum is maintained to preferentially desorb unreacted $ZrCl_4$ and also evacuates HCl leaving a layer of ZrC (step 116). The substrate is then cooled to room temperature (about 25° C.) (step 120). If a single monolayer of ZrC is desired, then the process is stopped. If more monolayers are desired, then the process returns to step 104 and the process is continued until the desired thickness is reached. The resulting thin film may be used as a barrier layer, which may be thinner than previous barrier layers.

In one variation of this example, a low energy plasma of methane may be used in place of the methane gas. Conditions are chosen to yield ionized methane molecules as the principal product In another variation of this example, atomic hydrogen and atomic carbon may be used in place of methane. This results in the reaction:

$$ZrCl_4 + 4H \rightarrow Zr + 4HCl \text{ and } Zr + C \rightarrow ZrC$$

Figure 8:
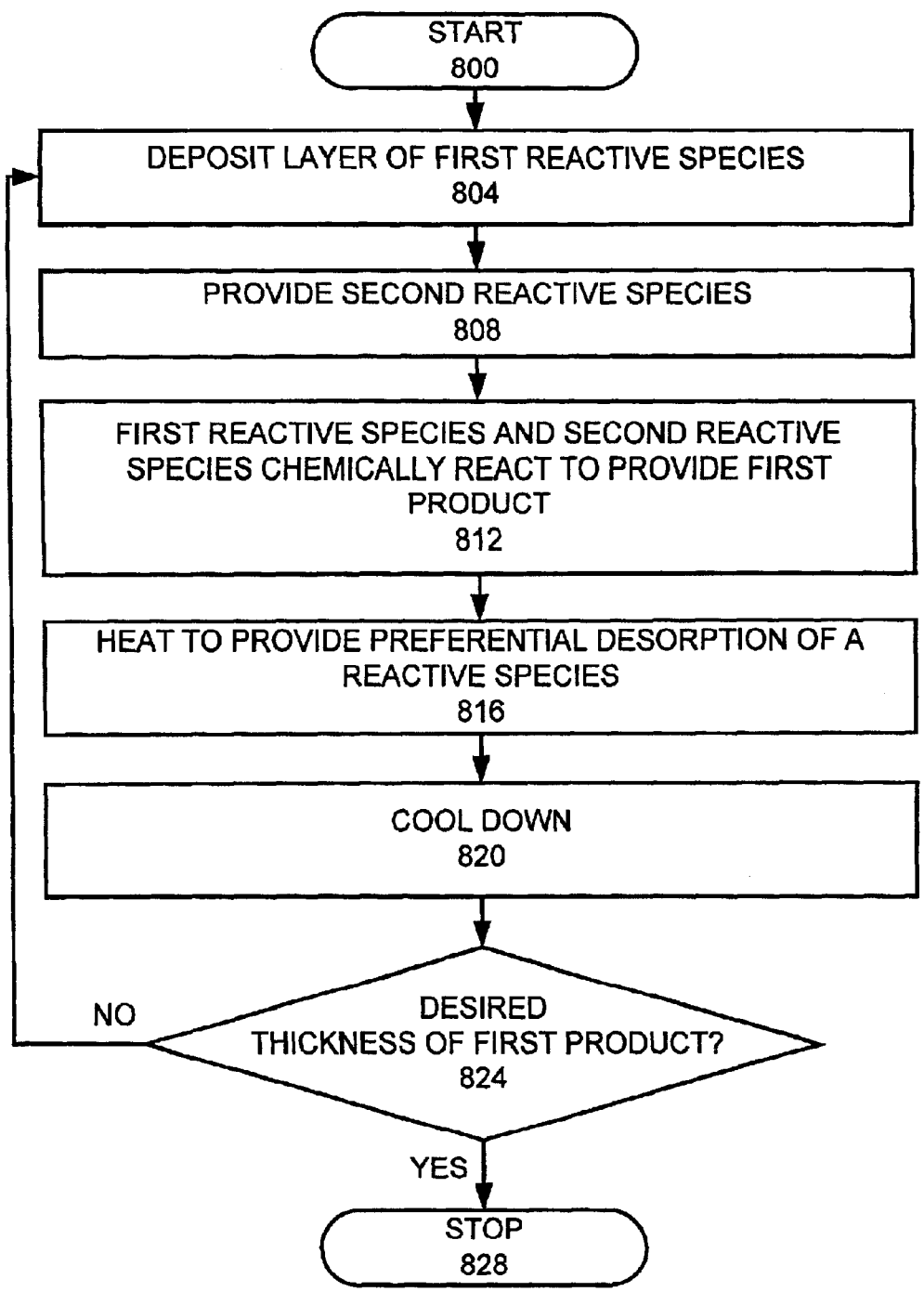
FIG. 8 is a generic flow chart of a process used in a preferred embodiment of the invention.

FIG. 8 is a flow chart of a more generic process that may be used in the invention. First, a layer of a first reactive species is deposited (step 804). Preferably, a monolayer, a single molecule or atom thick layer of the first reactive species, is deposited on a substrate. The deposition may be accomplished by condensation (physisorption) of a vapor of the first reactive species or by chemisorption of the first reactive species on the substrate. Both chemisorption and physisorption are adsorption processes. If the deposition is not a self-limiting chemisorption process, then conventional deposition techniques would be used to provide a monolayer coverage.

A second reactive species is provided (step 808). Preferably, the second reactive species is in the form of a low energy plasma. The first reactive species and the second reactive species chemically react to provide a first product (step 812). Additional products may also be produced. In addition, other reactive species may also be added to provide the first product. Heat is used to provide preferential desorption of the reactive species (step 816). Preferably, the substrate is heated to a temperature which allows preferential desorption, since at that temperature the vapor pressure of the reactive species is much greater than the vapor pressure of the first product. This is preferably accomplished by providing that the first product has a higher melting point than any of the reactive species. The desorbed reactive species should have a vapor pressure that allows the desorbed reactive species to condense on the substrate before the heating step. Cooling is then provided (step 820). Preferably, the substrate is cooled to a temperature that will allow the first reactive species to form a new layer over the substrate. A determination is made of whether a desired thickness of the first product is reached (step 824). If such a thickness is not reached, the process returns to step 804. If the thickness is reached, the process may be stopped (step 828).

The above examples are also examples of this more generic process, where the reactant species that is desorbed is the first reactant species. Other examples of this process may desorb the second reactive species. An example of this provides a monolayer of a first reactive species of strontium vapor condensed on a substrate maintained at a temperature of about 25° C. or less (step 808). The monolayer is exposed to a low energy plasma created with selenium with conditions chosen to yield selenium ions, which are the second reactive species (step 808). The selenium and strontium react according to the equation $Sr + Se(plasma) \rightarrow SrSe$ (step 812). The substrate temperature is raised to about 300° C. and a high vacuum is maintained to eliminate any unreacted selenium, which is the second reactive species and which has a vapor pressure of about 80 mTorr at about 300° C. (step 816). Alternatively, both unreacted selenium and strontium may be removed by heating to about 540° C. The vapor pressure of the unreacted selenium is about 75 Torr, and the vapor pressure of strontium at that temperature is about 7.5 mTorr. The melting point of the product SrSe is about 1600° C., and therefore has a vapor pressure at 540° C. that is negligible. The substrate is then cooled down to about 25° C. or less. If the desired thickness has been reached, the process is stopped. If not, the process goes back to step 804 and the process is continued until the desired thickness is reached. In this example, the second reactive species is desorbed, instead of the first reactive species in the previous examples.

It may be preferable to desorb the first reactive species, so that any unreacted species forming a monolayer is removed before a new monolayer is deposited.

Other examples of component layers may be rubidium or indium or a rubidium indium mixture monolayer as a first reactive species and selenium being a component of a second reactive species. Other examples of first reactant species especially suitable for barrier layers would be titanium tetrachloride ($TiCl_4$), titanium tetrabromide ($TiBr_4$) with a melting point of about 39° C., hafnium tetrachloride ($HfBr_4$) which sublimes at about 317° C., hafnium tetrabromide ($HfBr_4$) which sublimes at about 323° C., tantalum pentabromide ($TaBr_5$) which has a melting point of about 265° C. and a boiling point at about 349° C., and tantalum pentachloride ($TaCl_5$) which has a melting point at about 216° C. and a boiling point at about 239° C. When forming a layer over a substrate, the layer may be formed directly on the substrate or one or more other layers may be between the substrate and the layer formed over the substrate.

In the above examples, the substrate may be cooled to a temperature range from the temperature of liquid nitrogen to several degrees below the melting point of the first reactive species. More preferably, the substrate is cooled to a temperature range from about 25° C. to a temperature where the vapor pressure of the condensed reactive species is less than $10^{-3}$ mTorr. During desorption, the substrate would be heated to a temperature in the range from a temperature where the vapor pressure of the condensed reactive species with the lowest vapor pressure is greater than $10^{-1}$ mTorr to about 100 degrees below the melting point of the first product. More preferably, during desorption the substrate is heated to a temperature in the range from the temperature where the vapor pressure of the condensed reactive species with the lowest vapor pressure is about 7 mTorr to several hundred degrees below the melting point of the first product. During vapor deposition, the pressure is maintained at a range from $10^{-3}$ mTorr to 10 mTorr. More preferably, during vapor deposition the pressure is maintained at a range from $10^{-3}$ mTorr to $10^{-2}$ mTorr. During desorption, the pressure is maintained at a range from $10^{-3}$ mTorr to 1 mTorr. More preferably, during vapor deposition the pressure is maintained at a range from $10^{-3}$ mTorr to $10^{-2}$ mTorr.

While this invention has been described in terms of several preferred embodiments, there are alterations, modifications, permutations, and substitute equivalents, which fall within the scope of this invention. It should also be noted that there are many alternative ways of implementing the methods and apparatuses of the. present invention. It is therefore intended that the following appended claims be interpreted as including all such alterations, permutations, and substitute equivalents as fall within the true spirit and scope of the present invention.

What is claimed is:

1. A method of forming a layer over a substrate, comprising:

depositing a layer of a first reactive species over the substrate;

chemically reacting the layer of the first reactive species with a second reactive species to create a first product; and preferentially desorbing an unreacted reactive species leaving a layer of the first product.

2. The method, as recited in claim 1, wherein the depositing of a layer deposits a monolayer.

3. The method, as recited in claim 2, wherein the depositing of a layer is by simple vapor deposition.

4. The method, as recited in claim 3, wherein the simple vapor deposition is preformed by vaporizing a solid or liquid by heating.

5. The method, as recited in claim 4, wherein the unreacted reactive species that is desorbed is the first reactive species.

6. The method, as recited in claim 5, wherein the step of desorbing the unreacted first reactive species, comprises heating the layer.

7. The method, as recited in claim 6, further comprising:

cooling the layer after preferentially desorbing the unreacted first reactive species;

depositing a second layer of the first reactive species;

chemically reacting the layer of the first reactive species with the second reactive species to create the first product; and preferentially desorbing unreacted first reactive species leaving a second layer of the first product.

8. The method, as recited in claim 1, wherein the depositing of a layer is by simple vapor deposition.

9. The method, as recited in claim 8, wherein the unreacted reactive species that is desorbed is the first reactive species.

10. The method, as recited in claim 1, wherein the unreacted reactive species that is desorbed is the first reactive species.

11. The method, as recited in claim 1, wherein the step of desorbing the unreacted reactive species comprises heating the layer.

12. The method, as recited in claim 1, further comprising:

cooling the layer after preferentially desorbing the unreacted first reactive species;

depositing a second layer of the first reactive species;

chemically reacting the layer of the first reactive species with the second reactive species to create the first product; and preferentially desorbing unreacted reactive species leaving a second layer of the first product.

* * * * *